United States Patent
Leong et al.

(10) Patent No.: US 8,274,338 B2
(45) Date of Patent: Sep. 25, 2012

(54) METHODS AND SYSTEMS FOR GENERATING LOCAL OSCILLATOR SIGNALS

(75) Inventors: Frank Harald Erich Ho Chung Leong, Eindhoven (NL); Olivier Aymard, Caen (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/034,720

(22) Filed: Feb. 25, 2011

(65) Prior Publication Data

US 2011/0241748 A1    Oct. 6, 2011

(30) Foreign Application Priority Data

Mar. 2, 2010   (EP) ..................... 10155208

(51) Int. Cl.
*H03B 27/00*    (2006.01)
(52) U.S. Cl. .......................... 331/45; 331/55
(58) Field of Classification Search ............ 331/45, 331/55
See application file for complete search history.

(56) References Cited

U.S. PATENT DOCUMENTS

| | | | |
|---|---|---|---|
| 5,559,828 A * | 9/1996 | Armstrong et al. ........... | 375/130 |
| 6,842,054 B2 | 1/2005 | Wang | |
| 7,042,257 B2 | 5/2006 | Wang | |
| 2010/0029239 A1 | 2/2010 | Asuri | |

FOREIGN PATENT DOCUMENTS

| | | |
|---|---|---|
| WO | 03/065585 A1 | 8/2003 |
| WO | 2005/091493 A1 | 9/2005 |
| WO | 2008/018033 A2 | 2/2008 |

OTHER PUBLICATIONS

Reinhardt, V. et al. "A Short Survey of Frequency Synthesizer Techniques," 40th Annual Frequency Control Symposium, pp. 355-365 (1986).
Vaucher, C. et al. "A Family of Low-Power Truly Modular Programmable Dividers in Standard 0.35-μm CMOS Technology," IEEE J. of Solid-State Circuits, vol. 35, No. 7, pp. 1039-1045, (Jul. 2000).
van der Zwan E.J., et al. "A 10.7-MHz IF-to-Baseband ΣΔ A/D Conversion System for AM/FM Radio Receivers," IEEE J. of Solid-State Circuits, vol. 35, No. 12, pp. 1810-1819 (Dec. 2000).
He, X., et al. : "A 45nm Low-Power SAW-Less WCDMA Transmit Modulator Using Direct Quadrature Voltage Modulation," IEEE ISSCC, Session 6, No. 6.5, 3 pgs. (2009).
Ru, Z. et al. : "A Software-Defined Radio Receiver Architecture Robust to Out-of-Band Interference," IEEE ISSCC, Session 12, No. 12.8, 3 pgs. (2009).
Lam, N., et al. "Dynamic Quadrant Swapping Scheme Implemented in a Post Conversion Block for I, Q Mismatch Reduction in a DQPSK Receiver," IEEE J. of Solid-State Circuits, vol. 45, No. 2, pp. 322-337 (Feb. 2010).
Extended European Search Report for European Patent Appln. No. 10155208.1 (Sep. 17, 2010).

* cited by examiner

*Primary Examiner* — Joseph Chang

(57) ABSTRACT

A method is provided for generating local oscillator signals for a mixer. The method includes providing a reference frequency signal and generating a differential in-phase signal and a differential quadrature signal from the reference frequency signal. The method further includes re-clocking each of the differential in-phase and differential quadrature signals using the reference frequency signal. The re-clocked differential in-phase and differential quadrature signals are then provided as the local oscillator signals for the mixer.

20 Claims, 5 Drawing Sheets

US 8,274,338 B2

METHODS AND SYSTEMS FOR GENERATING LOCAL OSCILLATOR SIGNALS

This application claims the priority under 35 U.S.C. §119 of European patent application No. 10155208.1, filed on Mar. 2, 2010, the contents of which are incorporated by reference herein.

FIELD OF THE INVENTION

Information is transmitted in many wireless applications using Radio Frequency (RF) signals. Upon reception, an RF signal is down converted to a desired baseband frequency. RF signals may be directly down converted or may be processed by one or more intermediate stages before finally being converted to a desired baseband frequency.

BACKGROUND OF THE INVENTION

An RF receiver can include a frequency converter for frequency shifting a received RF spectrum, which includes various channels, to obtain an intermediate frequency spectrum in which one or more particular channels are selected. Conversely, an RF transmitter can include a frequency converter for frequency shifting a baseband signal, which includes information to be transmitted, to produce an RF signal.

A frequency converter can include a local oscillator and one or more mixers that are used to up-convert a transmit signal and/or to down-convert a received signal. The local oscillator provides a mixer driver signal, which is a periodical signal having a fundamental frequency. The mixer multiplies an input signal, which includes an input spectrum, by the mixer driver signal. The mixer provides an output signal that comprises a frequency-shifted version of the input spectrum. The fundamental frequency of the mixer driver signal generally determines the desired frequency shift.

One type of frequency converter is a multiphase frequency converter, which includes various mixers. The local oscillator provides various mixer driver signals including at least one mixer driver signal for each mixer. The respective mixer driver signals have a particular phase relationship with respect to each other. For example, a quadrature frequency converter can have two mixers referred to as an in-phase mixer and a quadrature mixer. The respective mixer driver signals for these mixers have a 90° phase relationship with respect to each other.

SUMMARY OF THE INVENTION

The present invention is exemplified in a number of implementations and applications, some of which are summarized below.

Consistent with an example embodiment of the present invention, a method is provided for generating local oscillator signals for a mixer. The method includes providing a reference frequency signal and generating a differential in-phase signal and a differential quadrature signal from the reference frequency signal. The method further includes re-clocking each of the differential in-phase and differential quadrature signals using the reference frequency signal. The re-clocked differential in-phase and differential quadrature signals are then provided as the local oscillator signals for the mixer.

According to another example embodiment of the present invention, a system is provided for generating local oscillator signals for a mixer. The system includes a signal generator that is configured to provide a reference frequency signal and a frequency divider configured to generate a differential in-phase signal and a differential quadrature signal from the reference frequency signal. The system further includes circuitry that is configured to re-clock each of the differential in-phase and differential quadrature signals using the reference frequency signal. The circuitry is further configured to provide the re-clocked differential in-phase and differential quadrature signals as the local oscillator signals for the mixer.

BRIEF DESCRIPTION OF THE DRAWINGS

The above summary is not intended to describe each embodiment or every implementation of the present disclosure. The figures and detailed description that follow more particularly exemplify various embodiments.

The present invention may be more completely understood in consideration of the following detailed description of various embodiments of the invention in connection with the accompanying drawings, in which.

DETAILED DESCRIPTION OF EMBODIMENTS

Figure 1A:
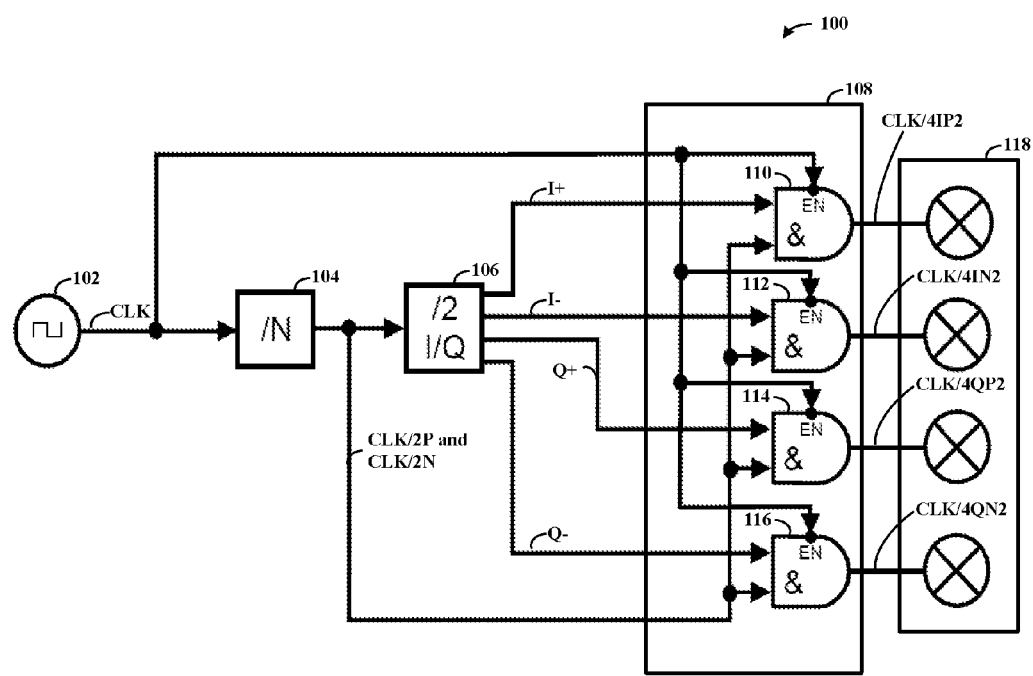
FIG. 1A is a block diagram of a system for generating local oscillator signals for a mixer, in accordance with an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

The present invention is believed to be applicable to a variety of different types of processes, devices and arrangements for use with generating local oscillator (LO) signals. While the present invention is not necessarily so limited, various aspects of the invention may be appreciated through a discussion of examples using this context.

According to an example embodiment of the present invention, a method is provided for generating local oscillator signals for a mixer. The method includes providing a reference frequency signal. The reference frequency signal can be generated by a signal generator such as an oscillator. The reference frequency signal is used to generate a differential in-phase signal and a differential quadrature signal. For example, a frequency divider can be used to generate the differential in-phase and differential quadrature signals from the reference frequency signal. The differential in-phase and differential quadrature signals have a frequency that is less than the frequency of the reference frequency signal. The reference frequency signal is then used to re-clock each of the differential in-phase and differential quadrature signals. In certain implementations, re-clocking involves aligning the differential in-phase and differential quadrature signals with the reference frequency signal. For example, re-clocking results in transitions of each of the differential in-phase and differential quadrature signals between high and low logic values coinciding with either the rising edges or the falling edges of the reference frequency signal. The re-clocked differential in-phase and differential quadrature signals are then provided as the local oscillator signals for the mixer.

According to another example embodiment of the present invention, a system is provided for generating local oscillator (LO) signals for a mixer. The system includes a reference frequency generator, such as an oscillator, that provides a reference frequency signal. The system also includes a frequency divider configured to generate a differential in-phase signal and a differential quadrature signal from the reference frequency signal. In one implementation, the frequency divider includes a first frequency divider that generates non-inverted and inverted signals from the reference frequency signal and a quadrature divider that generates the differential in-phase and differential quadrature signals from the inverted and non-inverted signals. The first frequency divider has a modulus N, meaning that the non-inverted and inverted signals have a period that is a factor N greater than the period of the reference frequency signal. The quadrature divider has a modulus of 2, meaning that the differential in-phase and differential quadrature signals having a period that is twice that of the period of the non-inverted and inverted signals.

The system further includes circuitry that re-clocks each of the differential in-phase and differential quadrature signals using the reference frequency signal and that provides the re-clocked differential in-phase and differential quadrature signals as the LO signals for the mixer. In one implementation, the re-clocked differential in-phase and differential quadrature signals have a 25% duty cycle.

In one embodiment of the present invention, the re-clocking of the each of the differential in-phase and differential quadrature signals with the same signal, the reference frequency signal, decreases the degradation of quadrature accuracy thereby providing for improved image rejection and reduced levels of interference. According to another example embodiment of the present invention, the re-clocking of the each of the differential in-phase and differential quadrature signals with the reference frequency signal improves the phase noise of the differential signals because the phase noise of the reference frequency signal is better than the phase noise of the signals generated along the divider chain. In yet another embodiment of the present invention, the power consumption overhead of the system is minimal due to the use of the already available reference frequency signal for re-clocking the differential signals.

Figure 1B:
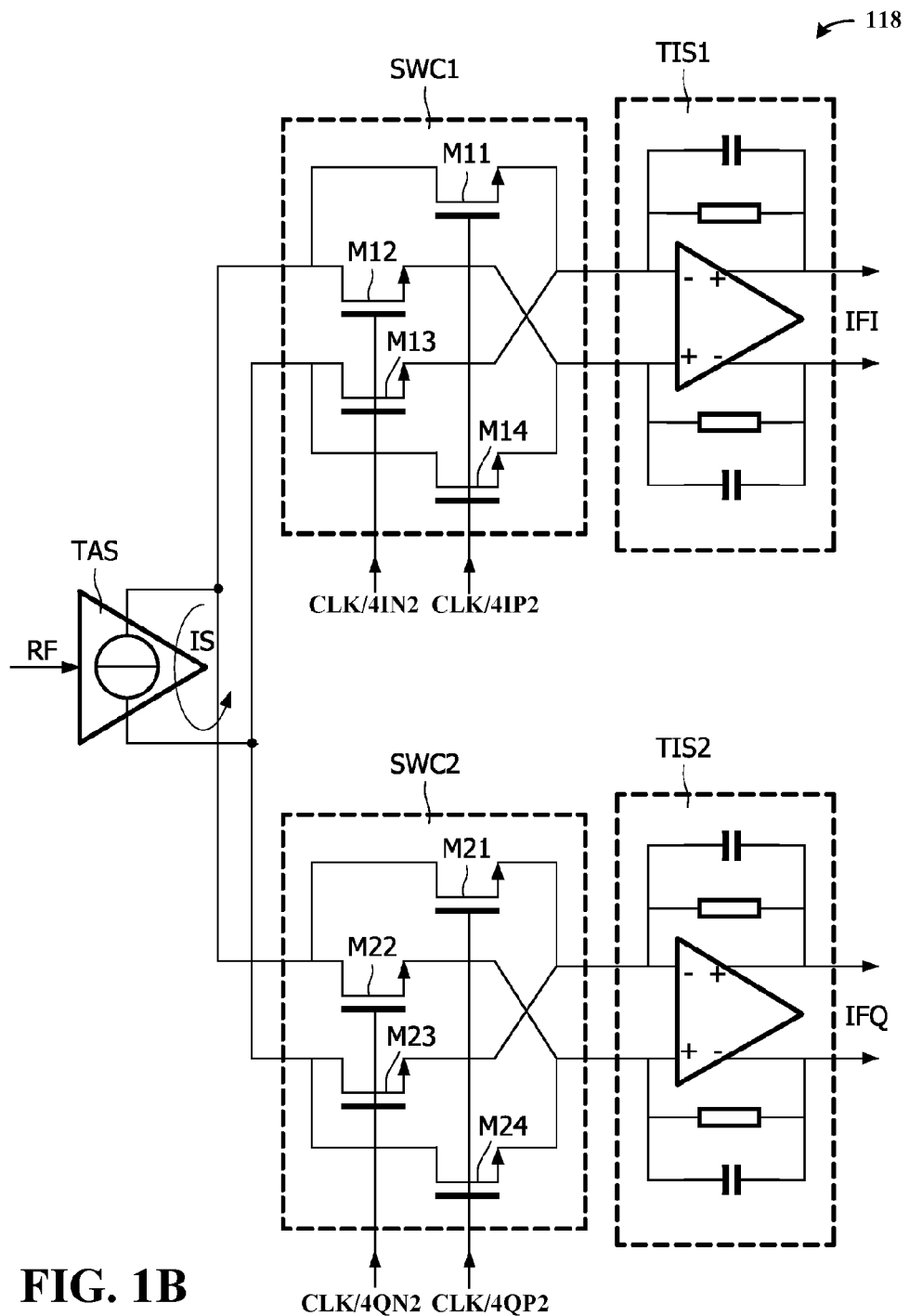
FIG. 1B is a circuit diagram of a system that includes a mixer, according to an example embodiment of the present invention.

FIG. 1A shows a block diagram of a system 100 for generating local oscillator (LO) signals for a mixer, in accordance with an example embodiment of the present invention. FIG. 1B shows a circuit diagram of a system that includes an example embodiment of the mixer 118 of FIG. 1A. The system 100 generates differential quadrature LO signals having a 25% duty cycle.

Figure 2:
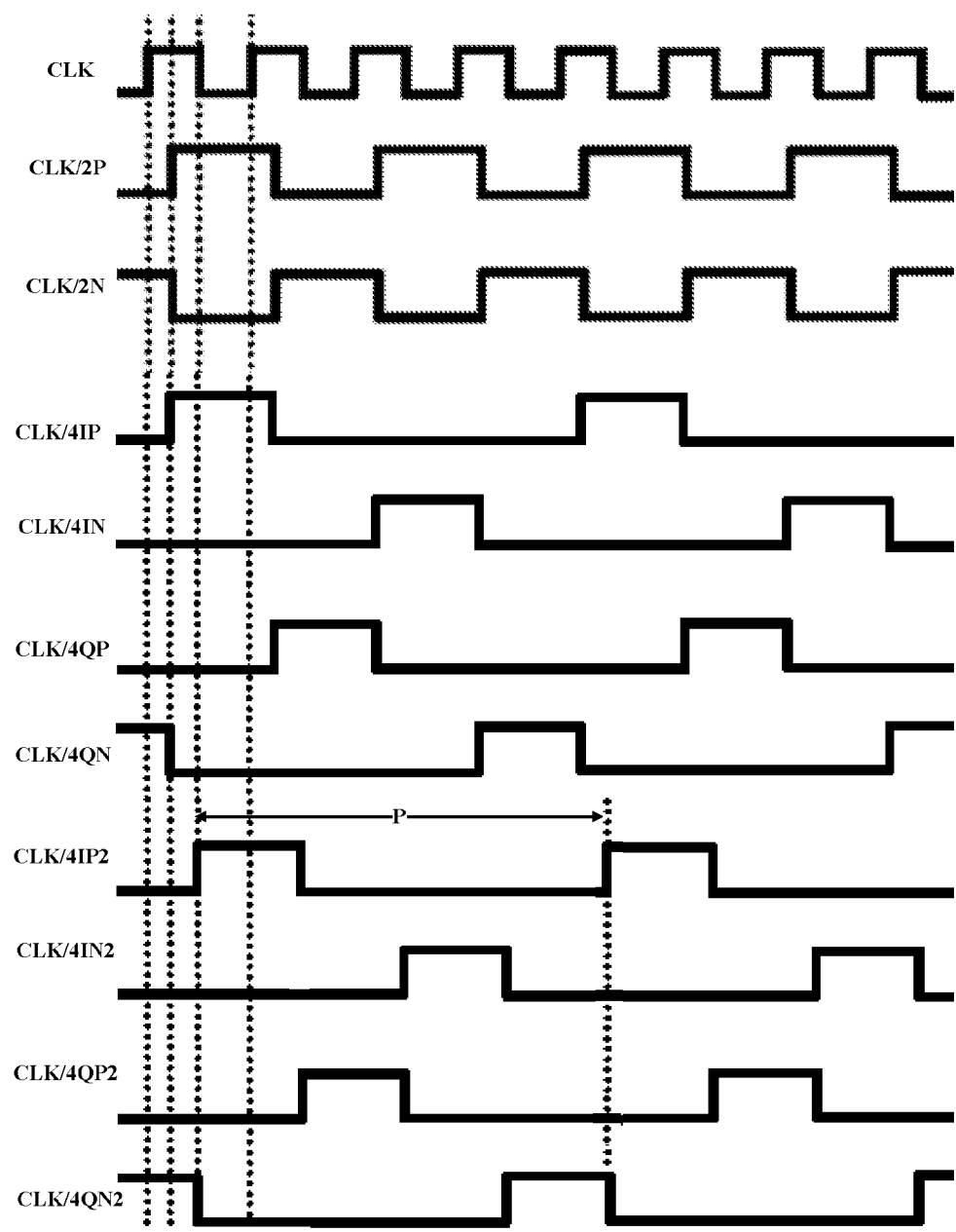
FIG. 2 shows the signal waveforms at various points in the system of FIG. 1A, according to an example embodiment of the present invention.

FIG. 2 shows the signal waveforms at selected points in the system 100 of FIG. 1A, according to an example embodiment of the present invention. As such, the operation of the system 100 will be described with reference to the signal waveforms illustrated in FIG. 2.

The system 100 includes a signal generator 102 configured to provide a reference frequency signal CLK to a frequency divider 104. The frequency divider 104 divides the reference frequency signal CLK by a factor N to produce a non-inverted signal and an inverted signal. The non-inverted and inverted signals constitute a differential signal. In one implementation, the frequency divider 104 is programmable, thereby allowing for the factor N to be selectively programmed. For the factor N being equal to two, the frequency divider 104 produces non-inverted signal CLK/2P and inverted signal CLK/2N shown in FIG. 2. The non-inverted signal CLK/2P and inverted signal CLK/2N have a frequency that is half that of the reference frequency signal CLK. In one implementation, the divider 104 introduces a delay in the non-inverted and inverted signals, which is shown in FIG. 2 as being, for example, one quarter of the period of the reference frequency signal CLK.

The frequency divider 104 provides the non-inverted and inverted signals to quadrature divider 106, which performs a frequency division by two on each of the signals. The quadrature divider 106 produces a pair of in-phase signals that include a non-inverted in-phase signal I+ and an inverted in-phase signal I− and a pair of quadrature signals that include a non-inverted quadrature signal Q+ and an inverted quadrature signal Q−. In one implementation, the quadrature divider 106 introduces a delay in the signals I+, I−, Q+ and Q−, which is less than one half of the period of the reference frequency signal CLK and can be, for example, between zero and forty percent of the period of CLK. In a specific implementation, the quadrature divider 106 introduces a delay of one quarter of the period of the reference frequency signal CLK. The signals I+, I−, Q+ and Q− each effectively constitute a square wave signal that has a 50% duty cycle.

The signal I+, I−, Q+ and Q− are provided to circuitry 108, which generates differential quadrature LO signals having a 25% duty cycle from these signals. The circuitry 108 includes four AND gates 110, 112, 114, and 116 that perform logic AND functions on different combinations of the signal I+, I−, Q+ and Q− and the non-inverted and inverted signals CLK/2P and CLK/2N. Specifically, AND gate 110 performs a logic AND function on the non-inverted signal CLK/2P and the non-inverted in-phase signal I+, which results in non-inverted in-phase signal CLK/4IP shown in FIG. 2. AND gate 112 performs a logic AND function on the non-inverted signal CLK/2P and the inverted in-phase signal I−, which results in inverted in-phase signal CLK/4IN shown in FIG. 2. AND gate 114 performs a logic AND function on the inverted signal CLK/2N and the non-inverted quadrature signal Q+, which results in non-inverted quadrature signal CLK/4QP shown in FIG. 2. AND gate 116 performs a logic AND function on the inverted signal CLK/2N and the inverted quadrature signal Q−, which results in inverted quadrature signal CLK/4QN shown in FIG. 2. The signals CLK/4IP, CLK/4IN, CLK/4QP and CLK/4QN have a 25% duty cycle.

The AND gates 110-116 each have an enable input EN that is supplied with the reference frequency signal CLK. The outputs of the AND gates 110-116 retain their previous state unless the signal provided to the enable inputs EN is high. When the enable inputs EN are high, the AND gates 110-116 operate in a convention manner with their outputs being based on their respective two inputs. The reference frequency signal CLK is used to re-clock the signals CLK/4IP, CLK/4IN, CLK/4QP and CLK/4QN. In one implementation, the AND gates 110-116 re-clock the signals CLK/4IP, CLK/4IN, CLK/4QP and CLK/4QN by aligning transitions of each of the signals CLK/4IP, CLK/4IN, CLK/4QP and CLK/4QN between high and low logic values to coincide with either the rising edges or the falling edges of the reference frequency signal CLK.

In the example shown in FIG. 2, the falling edges of the reference frequency signal CLK are used to re-clock the signals CLK/4IP, CLK/4IN, CLK/4QP and CLK/4QN. Thus, the enable inputs EN of the AND gates 110-116 would be low-active. Re-clocking the signals CLK/4IP, CLK/4IN, CLK/4QP and CLK/4QN using the falling edges of the reference frequency signal CLK results in LO signals CLK/4IP2, CLK/4IN2, CLK/4QP2 and CLK/4QN2 shown in FIG. 2. The LO signals CLK/4IP2, CLK/4IN2, CLK/4QP2 and CLK/4QN2 have a 25% duty cycle. The LO signals CLK/4IP2, CLK/4IN2, CLK/4QP2 and CLK/4QN2 are provided as the LO signals for mixer 118. In another implementation, the enable inputs EN of the AND gates 110-116 are high-active and the re-clocking of the signals CLK/4IP, CLK/4IN, CLK/4QP and CLK/4QN is performed using the rising edges of an inverted version of the reference frequency signal CLK.

According to another embodiment of the present invention, blocks 104 and 106 of FIG. 1A are replaced with logic circuitry that is configured to derive the signals output by blocks 104 and 106 directly from the reference frequency signal CLK. In another implementation, the above-described examples are altered by use of multiple reference frequency signals CLKs (e.g., synchronized with one another) from which the signals output by blocks 104 and 106 or such replacement logic circuitry are derived.

FIG. 1B shows a circuit diagram of the mixer 118 of FIG. 1A, according to an example embodiment of the present invention. The mixer 118 has a common transadmittance stage TAS that receives a radiofrequency signal RF. The mixer 118 includes two switch cells SWC1 and SWC2 and two transimpedance stages TIS1 and TIS2 that each having a non-inverting input "+" and an inverting input "−". The switch cell SWC1 and the transimpedance stage TIS1 constitute an in-phase mixer, which provides the in-phase intermediate frequency signal IFI. The switch cell SWC2 and the transimpedance stage TIS2 constitute a quadrature mixer, which provides the quadrature intermediate frequency signal IFQ. The switch cell SWC1 includes four transistors M11, M12, M13 and M14, with transistors M11 and M12 forming a switch pair and transistors M13 and 14 forming another switch pair. The switch cell SWC2, which is of similar construction to switch cell SWC1, also includes four transistors M21, M22, M13 and M24, with transistors M21 and M22 forming a switch pair and transistors M23 and M24 forming another switch pair.

The switch cell SWC1 receives a pair of in-phase mixer driver signals including the non-inverted in-phase LO signal CLK/4IP2 and the inverted in-phase LO signal CLK/4IN2, shown in FIG. 2. The switch cell SWC2 receives a pair of quadrature mixer driver signals including the non-inverted quadrature LO signal CLK/4QP2 and the inverted quadrature LO signal CLK/4QN2, shown in FIG. 2.

According to one embodiment of the present invention, the mixer 118 operates in the following manner. The common transadmittance stage TAS converts the radiofrequency signal RF into a differential signal current IS. At any given instant, either the transimpedance stage TIS1 or the transimpedance stage TIS2 receives the differential signal current IS in inverted form or in a non-inverted form. That is, at any given instant, only one of the two switch cells SWC1 and SWC2 constitutes a current-passing circuit, which allows the differential signal current IS to reach the transimpedance stage that is coupled to the switch cell concerned. The other switch cell constitutes a current-blocking circuit, which prevents the differential signal current IS from reaching the transimpedance stage that is coupled to the switch cell concerned. The switch cell that constitutes the current-passing circuit either applies the differential signal current IS to the transimpedance stage concerned in a non-inverted form or in an inverted form.

The set of mixer driver signals MD alternately cause switch cell SWC1 and switch cell SWC2 to momentarily constitute the current-passing circuit. Moreover, the set of mixer driver signals MD alternately cause switch cell SWC1 to apply the differential signal current IS to transimpedance stage TIS1 in a non-inverted form and in an inverted form, when switch cell SWC1 momentarily constitutes the current passing circuit during an interval of time and a subsequent interval of time, respectively. The same applies to switch cell SWC2, which alternately applies the differential signal current IS to transimpedance stage TIS2 in a non-inverted form during an interval of time when switch cell SWC2 momentarily constitutes the current-passing circuit and in an inverted form during a subsequent interval of time when switch cell SWC2 momentarily constitutes the current-passing circuit.

With reference to FIG. 2, each of the mixer driver signals CLK/4IP2, CLK/4IN2, CLK/4QP2 and CLK/4QN2 has an instantaneous signal level that may correspond with a high value or a low value. In the non-inverted in-phase mixer driver signal CLK/4IP2, pulses periodically occur with a period P, shown in FIG. 2. The non-inverted in-phase mixer driver signal CLK/4IP2 has the high value during a pulse and has the low value otherwise, with each pulse having a width that is substantially equal to one quarter of the period P. Consequently, the non-inverted in-phase mixer driver signal CLK/4IP2 corresponds with a square wave signal that has a duty cycle of approximately 25%. The other mixer driver signals CLK/4IN2, CLK/4QP2 and CLK/4QN2 are similar to the non-inverted in-phase mixer driver signal CLK/4IP2, as shown in FIG. 2. However, there is no overlap between the respective pulses in the respective mixer driver signals. That is, at any given instant, at most only a single mixer driver signal has the high value and the other three mixer driver signals have the low value. The mixer driver signals CLK/4IP2, CLK/4IN2, CLK/4QP2 and CLK/4QN2 have a particular phase relationship with respect to each other. The non-inverted quadrature mixer driver signal CLK/4QP2 has a 90° phase lag with respect to the non-inverted in-phase mixer driver signal CLK/4IP2. The 90° phase lag corresponds with a time shift of ¼ the period P, with a pulse in the non-inverted in-phase mixer driver signal CLK/4IP2 being followed by a pulse in the non-inverted quadrature mixer driver signal CLK/4QP2. The inverted in-phase mixer driver signal CLK/4IN2 has a 180° phase lag with respect to the non-inverted in-phase mixer driver signal CLK/4IP2. The 180° phase lag corresponds with a time shift of ½ of the period P. The inverted quadrature mixer driver signal CLK/4QN2 has a 270° phase lag with respect to the non-inverted in-phase mixer driver signal CLK/4IP2. The 270° phase lag corresponds with a time shift of ¾ of the period P.

Referring again to FIG. 1B, the mixer 118 uses the mixer driver signals CLK/4IP2, CLK/4IN2, CLK/4QP2 and CLK/4QN2 to downconvert the RF signal and produce an in-phase intermediate frequency signal IFI and a quadrature intermediate frequency signal IFQ.

The four transistors M11-M14 in switch cell SWC2 operate as switches, each of which may be in a conductive state or a nonconductive state. The same applies to the four transistors M21-M24 in switch cell SWC2. The transistors M11 and M14 are in the conductive state only when the non-inverted in-phase mixer driver signal CLK/4IP2 has a high value. The transimpedance stage TIS1 receives the differential signal current IS from the common transadmittance stage TAS in a non-inverted form only when the non-inverted in-phase mixer driver signal CLK/4IP2 has a high value. Similarly, the transistors M12 and M13 are in the conductive state only when the inverted in-phase mixer driver signal CLK/4IN2 has a high value. The transimpedance stage TIS1 receives the differential signal current IS from the transadmittance stage TAS in an inverted form only when the inverted in-phase mixer driver signal CLK/4IN2 has a high value. The pair of in-phase mixer driver signals CLK/4IP2 and CLK/4IN2 prevent switch cell SWC1 from transferring the differential signal current IS from the common transadmittance stage TAS to transimpedance stage TIS1 when the in-phase mixer driver signals both have a low value. Accordingly, the transimpedance stage TIS1 receives an input signal that corresponds with the differential signal current IS multiplied by an effective in-phase signal, which comprises positive pulses and negative pulses. The positive pulses correspond with the pulses in the non-inverted in-phase mixer driver signal CLK/4IP2 and the negative pulses correspond with the pulses in the inverted in-phase mixer driver signal CLK/4IN2. The effective in-phase signal has a fundamental frequency component that corresponds with the fundamental frequency of the set of mixer driver signals. In the above described manner, the mixer 118 uses the pair of in-phase mixer driver signals CLK/4IP2 and CLK/4IN2 to downconvert the RF signal and produce the in-phase intermediate frequency signal IFI.

The transistors M21 and M24 of switch cell SWC2 are in the conductive state only when the non-inverted quadrature mixer driver signal CLK/4QP2 has a high value. The transimpedance stage TIS2 receives the differential signal current IS from the common transadmittance stage TAS in a non-inverted form when the non-inverted quadrature mixer driver signal CLK/4QP2 has a high value. Similarly, the transistors M22 and M23 are in the conductive state only when the inverted quadrature mixer driver signal CLK/4QN2 has a high value. The transimpedance stage TIS2 receives the differential signal current IS from the common transadmittance stage TAS in an inverted form when the inverted quadrature mixer driver signal CLK/4QN2 has a high value. The pair of quadrature mixer driver signals CLK/4QP2 and CLK/4QN2 prevent switch cell SWC2 from transferring the differential signal current IS from the common transadmittance stage TAS to transimpedance stage TIS2 when the in-phase mixer driver signals both have a low value. Accordingly, the transimpedance stage TIS2 receives an input signal that corresponds with the differential signal current IS multiplied by an effective quadrature signal, which comprises positive pulses and negative pulses. The positive pulses correspond with the pulses in the non-inverted quadrature mixer driver signal CLK/4QP2 and the negative pulses correspond with the pulses in the inverted quadrature mixer driver signal CLK/4QN2. The effective quadrature signal has a fundamental frequency component that corresponds with a 90° phase shifted version of the fundamental frequency component in the effective in-phase signal. In the above described manner, the mixer 118 uses the pair of quadrature mixer driver signals CLK/4QP2 and CLK/4QN2 to downconvert the RF signal and produce the quadrature intermediate frequency signal IFQ.

Figure 3A:
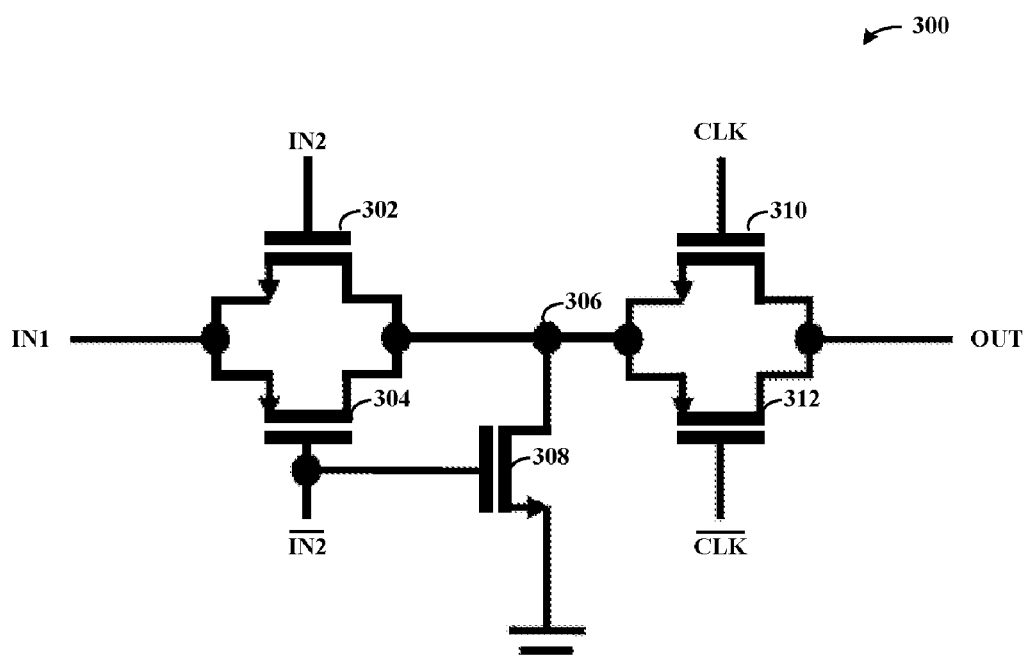
FIG. 3A is a circuit diagram of an AND gate with an enable input, according to an example embodiment of the present invention.

FIG. 3A is a circuit diagram of an AND gate 300 with an enable input, according to an example embodiment of the present invention. The AND gate 300 performs a logic AND function on input signals IN1 and IN2 to produce output signal OUT. In one implementation, the input signal IN1 is one of the non-inverted and inverted signals CLK/2P and CLK/2N, the input signal IN2 is one of the signals I+, I−, Q+ and Q−, and the output signal is one of the mixer driver signals CLK/4IP2, CLK/4IN2, CLK/4QP2 and CLK/4QN2.

The AND gate 300 includes an NMOS transistor 302 that receives the input signal IN2 and a PMOS transistor 304 that receives the inverse of the input signal IN2. The transistors 302 and 304 are both active when the input signal IN2 has a high logic value and, as such, the value of the input signals IN1 is passed on by the transistors 302 and 304 to node 306 when input signal IN2 has a high logic value. The AND gate 300 also includes an NMOS transistor 308 that receives the inverse of input signal IN2. The transistor 308 is active when the input signal IN2 has a low logic value, thereby pulling the signal at node 306 to ground. Thus, the signal at node 306 has a high logic value only when both of the input signals IN1 and IN2 have a high logic value and otherwise the signal at node 306 has a low logic value. The transistors 302, 304 and 308 perform a logic AND function on input signals IN1 and IN2.

The AND gate 300 further includes an NMOS transistor 310 that receives the reference frequency signal CLK and a PMOS transistor 312 that receives the inverse of the reference frequency signal CLK. The transistors 310 and 312 function as a high-active enable-input that uses the reference frequency signal CLK to re-clock the signal at node 306 and produce the output signal OUT. The signal at node 306 is re-clocked relative to a rising edge of the reference frequency signal CLK to produce the output signal OUT. In one implementation, the reference frequency signal CLK and the inverse of the reference frequency signal CLK can be interchanged to make the enable input active-low. In this instance, the signal at node 306 is re-clocked relative to a falling edge of the reference frequency signal CLK to produce the output signal OUT.

Figure 3B:
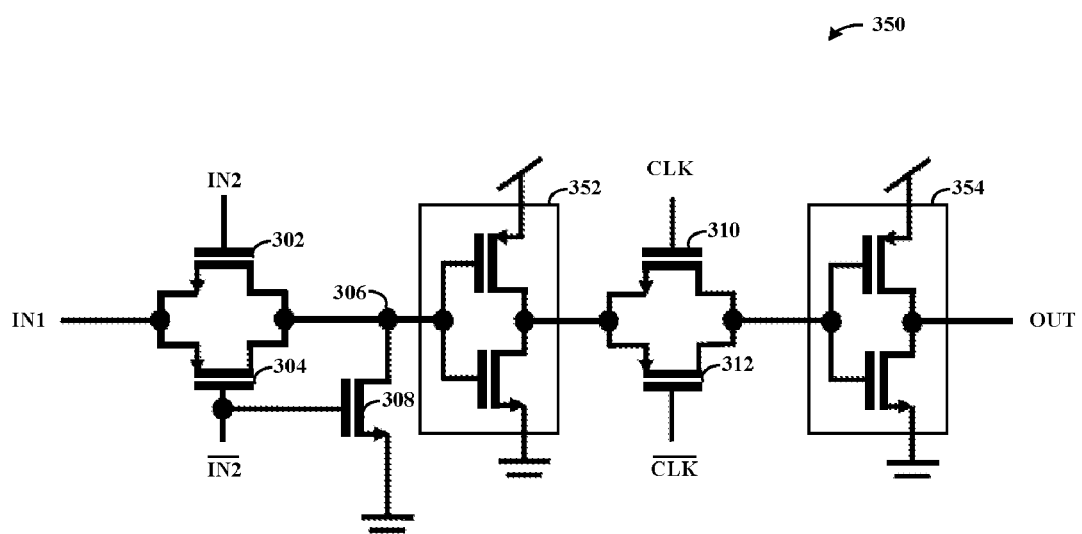
FIG. 3B is a circuit diagram of an AND gate with an enable input, according to another example embodiment of the present invention.

FIG. 3B is a circuit diagram of an AND gate 350 with an enable input, according to another example embodiment of the present invention. The AND gate 350 is similar to the AND gate 300 of FIG. 3A and, as such, common reference characters are used for common elements. The AND gate 350 performs a logic AND function on input signals IN1 and IN2 to produce output signal OUT. The AND gate 350 includes two invertors 352 and 354 that sharpen transition edges of the output signal OUT.

Based upon the above discussion and illustrations, those skilled in the art will readily recognize that various modifications and changes may be made to the present invention without strictly following the exemplary embodiments and applications illustrated and described herein. Such modifications do not depart from the true spirit and scope of the present invention, including that set forth in the following claims.

What is claimed is:

1. A method for generating local oscillator signals for a mixer, the method comprising:
   providing a reference frequency signal;
   generating a differential in-phase signal and a differential quadrature signal from, and delayed relative to, the reference frequency signal, thereby providing a delayed differential in-phase signal, and a delayed quadrature signal;
   re-clocking each of the differential in-phase and differential quadrature signals, by using the reference frequency signal which is not delayed relative to the differential in-phase and differential quadrature signals as delayed; and
   providing the re-clocked differential in-phase and differential quadrature signals as the local oscillator signals for the mixer.

2. The method of claim 1, wherein generating the differential in-phase and differential quadrature signals includes
   generating non-inverted and inverted signals from the reference frequency signal, the non-inverted and inverted signals having a period that is a factor N greater than that of the reference frequency signal, and generating the differential in-phase and differential quadrature signals from the inverted and non-inverted signals, the differential in-phase and differential quadrature signals having a period that is twice that of the non-inverted and inverted signals.

3. The method of claim 2, wherein the factor N is 2.

4. The method of claim 2, wherein re-clocking each of the differential in-phase and differential quadrature signals includes
performing a logic AND function on the non-inverted signal and a non-inverted in-phase signal of the differential in-phase signal to generate a first signal,
performing a logic AND function on the non-inverted signal and an inverted in-phase signal of the differential in-phase signal to generate a second signal,
performing a logic AND function on the non-inverted signal and an inverted in-phase signal of the differential in-phase signal to generate a second signal,
performing a logic AND function on the inverted signal and a non-inverted quadrature signal of the differential quadrature signal to generate a third signal,
performing a logic AND function on the inverted signal and an inverted quadrature signal of the differential quadrature signal to generate a fourth signal, and
re-clocking each of the first, second, third and fourth signals using the reference frequency signal to generate the local oscillator signals for the mixer.

5. A method for generating local oscillator signals for a mixer, the method comprising:
providing a reference frequency signal;
generating a differential in-phase signal and a differential quadrature signal from the reference frequency signal;
re-clocking each of the differential in-phase and differential quadrature signals using the reference frequency signal, wherein each of the re-clocked differential in-phase and quadrature signals has a 25% duty cycle; and
providing the re-clocked differential in-phase and differential quadrature signals as the local oscillator signals for the mixer.

6. The method of claim 1, wherein re-clocking each of the differential in-phase and differential quadrature signals includes re-clocking each of the differential in-phase and differential quadrature signals responsive to an edge of the reference frequency signal.

7. The method of claim 1, wherein the re-clocking of each of the differential in-phase and differential quadrature signals using the reference frequency signal includes aligning transitions of each of the differential in-phase and differential quadrature signals between high and low logic values to coincide with either the rising edges or the falling edges of the reference frequency signal.

8. The method of claim 1, wherein generating the differential in-phase and differential quadrature signals from the reference frequency signal introduces a delay in each of the differential in-phase and differential quadrature signals relative to the reference frequency signal.

9. The method of claim 8, wherein the delay in each of the differential in-phase and differential quadrature signals is less than one half the period of the reference frequency signal.

10. A system for generating local oscillator signals for a mixer, the system comprising:
a signal generator configured to provide a reference frequency signal;
a frequency divider configured to generate a differential in-phase signal and a differential quadrature signal from the reference frequency signal, the differential in-phase signal and the differential quadrature signal being delayed relative to the reference frequency signal; and
circuitry configured to re-clock each of the differential in-phase and differential quadrature signals, by using the reference frequency signal which is delayed relative to the differential in-phase and differential quadrature signals as delayed, for providing the re-clocked differential in-phase and differential quadrature signals as the local oscillator signals for the mixer.

11. The system of claim 10, wherein the frequency divider includes
a first frequency divider configured to generate non-inverted and inverted signals from the reference frequency signal, the non-inverted and inverted signals having a period that is a factor N greater than that of the reference frequency signal, and
a quadrature divider configured to generate the differential in-phase and differential quadrature signals from the inverted and non-inverted signals, the differential in-phase and differential quadrature signals having a period that is twice that of the non-inverted and inverted signals.

12. The system of claim 11, wherein the factor N is 2.

13. The system of claim 11, wherein the circuitry includes a plurality of AND gates that each have an enable input, a first one of the AND gates configured to perform a logic AND function on the non-inverted signal and a non-inverted in-phase signal of the differential in-phase signal, a second one of the AND gates configured to perform a logic AND function on the non-inverted signal and an inverted in-phase signal of the differential in-phase signal, a third one of the AND gates configured to perform a logic AND function on the inverted signal and a non-inverted quadrature signal of the differential quadrature signal, and a fourth one of the AND gates configured to perform a logic AND function on the inverted signal and an inverted quadrature signal of the differential quadrature signal.

14. The system of claim 13, wherein the plurality of AND gates are configured to receive the reference frequency signal at their enable inputs.

15. A system for generating local oscillator signals for a mixer, the system comprising:
a signal generator configured to provide a reference frequency signal;
a frequency divider configured to generate a differential in-phase signal and a differential quadrature signal from the reference frequency signal, and
circuitry configured to re-clock each of the differential in-phase and differential quadrature signals using the reference frequency signal and to provide the re-clocked differential in-phase and differential quadrature signals as the local oscillator signals for the mixer, wherein each of the re-clocked differential in-phase and quadrature signals has a 25% duty cycle.

16. The system of claim 10, wherein the circuitry is configured to re-clock each of the differential in-phase and differential quadrature signals responsive to an edge of the reference frequency signal.

17. The system of claim 10, wherein the circuitry is configured to re-clock each of the differential in-phase and differential quadrature signals using the reference frequency signal by aligning transitions of each of the differential in-phase and differential quadrature signals between high and low logic values to coincide with either the rising edges or the falling edges of the reference frequency signal.

18. The system of claim 10, wherein the frequency divider is further configured to introduce a delay in each of the differential in-phase and differential quadrature signals relative to the reference frequency signal.

19. The system of claim 18, wherein the delay in each of the differential in-phase and differential quadrature signals is less than one half the period of the reference frequency signal.

20. The system of claim 10, further comprising the mixer, wherein the mixer is configured to use the local oscillator signals to downconvert a received radio frequency signal.

* * * * *